United States Patent
Yan et al.

(10) Patent No.: US 12,146,919 B2
(45) Date of Patent: Nov. 19, 2024

(54) SHORT CIRCUIT DETECTION METHOD FOR STARTING BATTERY

(71) Applicant: NIO TECHNOLOGY (ANHUI) CO., LTD, Hefei (CN)

(72) Inventors: Zhujun Yan, Hefei (CN); Wei Yao, Hefei (CN); Degang Xu, Hefei (CN); Liulin Wang, Hefei (CN); Ming Chen, Hefei (CN)

(73) Assignee: NIO Technology (Anhui) Co., Ltd., Hefei (CN)

( * ) Notice: Subject to any disclaimer, the term of this patent is extended or adjusted under 35 U.S.C. 154(b) by 74 days.

(21) Appl. No.: 17/891,581

(22) Filed: Aug. 19, 2022

(65) Prior Publication Data

US 2023/0057159 A1    Feb. 23, 2023

(30) Foreign Application Priority Data

Aug. 20, 2021 (CN) ............ 202110960833.2

(51) Int. Cl.
| | |
|---|---|
| *G01R 31/3842* | (2019.01) |
| *B60L 3/00* | (2019.01) |
| *B60L 58/12* | (2019.01) |
| *G01R 31/396* | (2019.01) |
| *H01M 10/44* | (2006.01) |
| *H01M 10/48* | (2006.01) |

(52) U.S. Cl.
CPC ........ *G01R 31/3842* (2019.01); *B60L 3/0046* (2013.01); *G01R 31/396* (2019.01); *H01M 10/446* (2013.01); *H01M 10/48* (2013.01); *B60L 58/12* (2019.02); *B60L 2240/547* (2013.01); *B60L 2240/549* (2013.01); *H01M 2220/20* (2013.01)

(58) Field of Classification Search
CPC .... B60L 58/14; G01R 31/396; G01R 31/3842
USPC ........................................ 324/426, 430–435
See application file for complete search history.

(56) References Cited

U.S. PATENT DOCUMENTS

| | | | |
|---|---|---|---|
| 2016/0054389 A1* | 2/2016 | Koba ................. | G01R 31/52 324/426 |
| 2020/0321668 A1* | 10/2020 | Xiong ................ | H05B 3/0014 |
| 2022/0268856 A1* | 8/2022 | Kim .................. | G01R 31/367 |

FOREIGN PATENT DOCUMENTS

| | | |
|---|---|---|
| CN | 109613432 A | 4/2019 |
| CN | 111108403 A | 5/2020 |

* cited by examiner

*Primary Examiner* — Vincent Q Nguyen
(74) *Attorney, Agent, or Firm* — Dorsey & Whitney LLP

(57) ABSTRACT

A short circuit detection method is provided for a starting battery. The method includes acquiring status information of the starting battery in real time, estimating a state-of charge (SOC) of the starting battery by an ampere-hour integral based on the status information, and confirming, based on an estimation result for the SOC, whether the starting battery is short-circuited.

9 Claims, 1 Drawing Sheet

SHORT CIRCUIT DETECTION METHOD FOR STARTING BATTERY

CROSS-REFERENCE TO RELATED APPLICATION

This patent application claims priority to Chinese Patent Application No. CN 2021 1096 0833.2, filed Aug. 20, 2021, which is incorporated by reference herein, in the entirety and for all purposes.

FIELD

The disclosure relates to the technical field of starting batteries, and in particular, to a short circuit detection method for a starting battery.

BACKGROUND

With the current development of new energy industry, battery electric vehicles become more and more popular, and people constantly raise increasingly high requirements for performance, functionality, safety, etc. of electric vehicles. A starting battery is a core component of an electric vehicle, and therefore, an increasingly high requirement for management of the starting battery is also raised. A starting battery is produced in a poor environment with a low degree of automation, and is prone to cause problems, such as lead slag residue, lead paste bulge, and polar plate deformation, which may lead to a short circuit of the starting battery. During remote upgrade and vehicle battery swapping, when the starting battery is required to perform discharging after a vehicle is locked, the starting battery cannot perform continuous discharging due to the short circuit, resulting in upgrade failure and battery swapping failure, such that a vehicle gets stuck in a battery swap station. Thus, it is particularly important to monitor a change in an SOC of the starting battery in real time, and identify a vehicle of which a starting battery suffers from an internal short circuit, such that the battery is swapped in a timely manner.

SUMMARY

An object of the disclosure is to provide a short circuit detection method for a starting battery, to monitor a change in a state of charge (SOC) of the starting battery in real time, and identify, according to the change in the SOC of the starting battery, a vehicle of which a starting battery suffers from an internal short circuit.

The object of the disclosure is achieved by using the following technical solutions. The disclosure provides a short circuit detection method for a starting battery, the method including: acquiring status information of the starting battery in real time; estimating an SOC of the starting battery by means of ampere-hour integral based on the status information; and confirming, based on an estimation result for the SOC, whether the starting battery is short-circuited.

Moreover, the object of the disclosure may further be achieved by using the following technical measures.

In the short circuit detection method for a starting battery, the status information includes current, voltage, and time.

The short circuit detection method for a starting battery further includes setting an SOC threshold of the starting battery, where the SOC threshold of the starting battery is set such that a power battery charges the starting battery if the SOC of the starting battery is equal to or lower than the SOC threshold.

The short circuit detection method for a starting battery further includes setting a voltage threshold of the starting battery, where the voltage threshold of the starting battery is set such that a power battery charges the starting battery if a voltage of the starting battery is equal to or lower than the voltage threshold of the starting battery.

In the short circuit detection method for a starting battery, the voltage threshold is lower than a voltage value of the starting battery when the SOC of the starting battery is at the SOC threshold.

In the short circuit detection method for a starting battery, the step of confirming, based on an estimation result for the SOC, whether the starting battery is short-circuited includes: sending the estimation result for the SOC to a vehicle control unit; sending, by the vehicle control unit, the estimation result for the SOC to a central gateway; sending, by the central gateway, the estimation result for the SOC to a cloud database; drawing an SOC curve according to the estimation result for the SOC, and conforming, by the cloud database, that the starting battery is in a short-circuited condition if the SOC curve initially increases within a predetermined period of time and then maintains constant.

In the short circuit detection method for a starting battery, an SOC curve of a starting battery, which is not short-circuited, initially decreases and then increases in cycle.

In the short circuit detection method for a starting battery, the cloud database confirms that the starting battery is in the short-circuited condition if the SOC of the starting battery initially increases to 100% within the predetermined period of time and then maintains constant.

The disclosure further provides a short circuit detection device for a starting battery, the device including: an acquisition module configured to acquire status information of the starting battery in real time; an estimation module configured to estimate an SOC of the starting battery by means of ampere-hour integral based on the status information; and a confirmation module configured to confirm, based on an estimation result for the SOC, whether the starting battery is short-circuited.

The disclosure further provides a computer-readable storage medium storing an executable instruction that, when executed by a processor, causes the foregoing short circuit detection method for a starting battery to be performed.

Beneficial effects of the disclosure at least include: by acquiring status information of the starting battery in real time, estimating an SOC of the starting battery by means of ampere-hour integral based on the status information, and confirming, based on an estimation result for the SOC, whether the starting battery is short-circuited, a vehicle of which a starting battery suffers from an internal short circuit can be identified according to a change in the SOC of the starting battery, such that the battery is swapped in a timely manner, thereby preventing upgrade failure or the vehicle from getting stuck in an unattended battery swap station.

The aforementioned description is only an overview of the technical solutions of the disclosure. In order to clearly understand the technical means of the disclosure, the disclosure can be implemented according to the contents of the description; and in order to make the aforementioned and other objectives, features and advantages of the disclosure more obvious and understandable, preferred embodiments are described in detail below with reference to the accompanying drawings.

DETAILED DESCRIPTION

The technical solutions in the embodiments of the disclosure will be clearly described below in conjunction with the accompanying drawings in the embodiments of the disclosure. Obviously, the described embodiments are merely some, rather than all, of the embodiments of the disclosure. Based on the embodiments of the disclosure, all other embodiments obtained by those of ordinary skills in the art without going through any creative work shall fall within the scope of protection of the disclosure.

The short circuit detection method for a starting battery provided in the disclosure can be used in the field of new energy vehicles and the field of hybrid vehicles, which is not specifically limited in the disclosure.

Figure 1:
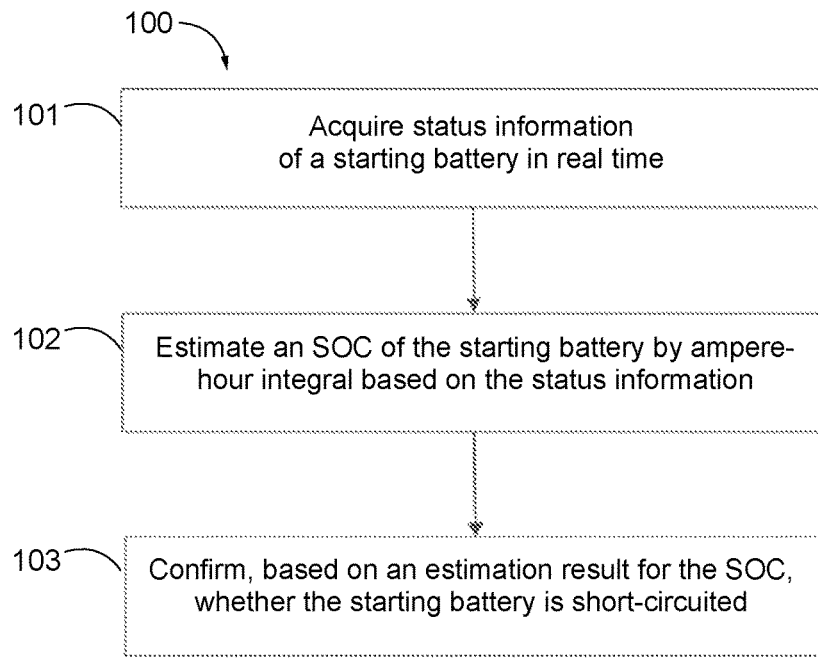
FIG. 1 is a flowchart of a short circuit detection method for a starting battery according to an embodiment of the disclosure.

As shown in FIG. 1, the short circuit detection method 100 for a starting battery provided in the disclosure includes:

S101 (step 101): acquiring status information of the starting battery in real time.

Specifically, the acquisition of status information of the starting battery in real time is implemented by a current sensor, where the status information includes information such as current, voltage, and time of the starting battery. The current sensor is connected to the starting battery in a new energy vehicle, and is connected to a vehicle control unit through a communication line. The current sensor can be used in a starting battery of a battery electric vehicle or a hybrid vehicle, and is connected to a BMS system to detect a charging and discharging current, thereby improving the service efficiency of the starting battery. The current sensor has a good accuracy and stability because of galvanically isolated measurement of a direct current, an alternating current or a pulse current. During charging and discharging of the starting battery, the BMS can acquire, by the current sensor, a voltage, temperature, a charging and discharging current, and a total voltage of the starting battery of the electric vehicle or the hybrid vehicle in real time, thereby preventing an over-charging or over-discharging phenomenon from occurring in the starting battery. In addition, by means of the current sensor, the BMS can also detect a battery condition in a timely manner, such that situations of battery leakage, insulation damage and partial short circuit are effectively eliminated, thereby maintaining the reliability and efficiency of operation of a power battery. Thereafter, the processing proceeds to step S102.

S102 (step 102): estimating an SOC of the starting battery by means of ampere-hour integral based on the status information.

Specifically, SOC refers to a state of charge. The estimation of an SOC of the starting battery by means of ampere-hour integral based on the status information is also implemented by the current sensor. In an ampere-hour integral method, a mechanism of action in the starting battery is not considered, but instead a total amount of power flowing into and out of the battery is calculated based on external characteristics such as current and time and through integration for the time and the current, to estimate the SOC of the starting battery. A calculation formula of the ampere-hour integral method is as follows:

$$SOC = SOC_0 - \frac{1}{C_E} \int_0^t \eta I(t) d_t$$

where $SOC_0$ is an initial value of the state of charge of the battery; $C_E$ is a rated capacity of the battery; $I(t)$ is a charging and discharging current of the battery at a moment t; t is a charging and discharging time; and $\eta$ is a charging and discharging efficiency coefficient, also known as a Coulomb efficiency coefficient, which represents power dissipation inside the battery during charging and discharging, and is generally based on a charging-discharging rate and a temperature correction coefficient.

According to the disclosure, estimating the SOC of the starting battery by using the ampere-hour integral method is an important part for determining whether the starting battery is short-circuited. Based on the time and the current measured by the current sensor in real time, an estimation result for the SOC can be obtained in real time by using the ampere-hour integral method, such that the SOC of the starting battery can be estimated in real time. Thereafter, the processing proceeds to step S103.

S103 (step 103): confirming, based on an estimation result for the SOC, whether the starting battery is short-circuited.

Specifically, since the current sensor is connected to the vehicle control unit through the communication line, the current sensor sends the estimation result for the SOC of the starting battery to the vehicle control unit, the vehicle control unit sends the estimation result for the SOC to the central gateway, the central gateway sends the estimation result for the SOC to the cloud database, and the cloud database manages the estimation result for the SOC of the starting battery. An SOC curve is drawn according to the estimation result for the SOC, and the cloud database confirms that the starting battery is in a short-circuited condition if the SOC curve initially increases within a predetermined period of time and then maintains constant.

Specifically, if the starting battery is not in the short-circuited condition, the new energy vehicle or the hybrid vehicle, after being stalled and locked, is completely powered by the starting battery. In this case, the SOC of the starting battery may gradually decrease, and a voltage of the starting battery also decreases, which is a continuous and slow process. According to the disclosure, the SOC threshold of the starting battery is set (for example, as 74%), and the SOC threshold is set such that, if the SOC of the starting battery decreases to or below the SOC threshold, the starting battery may trigger, by a message, a power battery to charge the starting battery, to increase the SOC of the starting battery, where the SOC threshold can be set by the vehicle control unit. After the power battery charges the starting battery to 100%, the SOC of the starting battery will continue to decrease during powering for the starting battery, and when the SOC decreases to the SOC threshold, the power battery continues to charge the starting battery until the starting battery is fully charged. Therefore, if a curve is drawn for an SOC of a starting battery which is not short-circuited, the SOC curve of the starting battery which is not short-circuited initially decreases and then increases in cycle.

Specifically, if the starting battery is in the short-circuited condition, the starting battery cannot continuously discharge at a large current after the new energy vehicle or the hybrid vehicle is stalled and locked. In this case, a voltage of the short-circuited starting battery may decrease rapidly. According to the disclosure, the vehicle control unit is used to set a voltage threshold (for example, 11.4 V) of the starting battery, and the voltage threshold is set such that the power battery charges the starting battery if a voltage of the starting battery is equal to or lower than the voltage threshold. It can be understood that the voltage threshold is lower than a voltage value of the starting battery when the SOC of the starting battery is at the SOC threshold. When the voltage of the short-circuited starting battery rapidly decreases to or below the voltage threshold, the power battery is trigged to charge the starting battery, such that the voltage of the starting battery will increase rapidly, and the whole process may happen in a very short time. In this case, according to the formula of ampere-hour integral, a discharge time t goes to 0, the short-circuited starting battery basically performs no discharging, which causes the short-circuited starting battery to be continuously charged by the power battery from an initial value of the SOC after the vehicle is stalled and locked. Therefore, the SOC curve of the short-circuited starting battery initially increases within a predetermined period of time (such as 3 hours) and then maintains constant.

Optionally, according to the disclosure, the vehicle control unit is used to perform setting such that, if the voltage of the starting battery is lower than the voltage threshold of the starting battery, the starting battery is charged for a predetermined period of time (such as 1 hour) and then charging is disconnected, and after charging from the power battery is disconnected, the voltage of the short-circuited starting battery rapidly decreases below the voltage threshold of the starting battery again, which triggers the power battery to charge the short-circuited starting battery. In this way, the short-circuited starting battery can be in a circularly charged state until the SOC of the short-circuited starting battery reaches 100%. The cloud database can identify the starting battery, of which the SOC is at 100% over a long period of time, as the short-circuited battery.

Beneficial effects of the disclosure at least include: by acquiring status information of the starting battery in real time, estimating an SOC of the starting battery by means of ampere-hour integral based on the status information, and confirming, based on an estimation result for the SOC, whether the starting battery is short-circuited, a vehicle of which a starting battery suffers from an internal short circuit can be identified according to a change in the SOC of the starting battery, such that the battery is swapped in a timely manner, thereby preventing upgrade failure or the vehicle from getting stuck in an unattended battery swap station.

Figure 2:
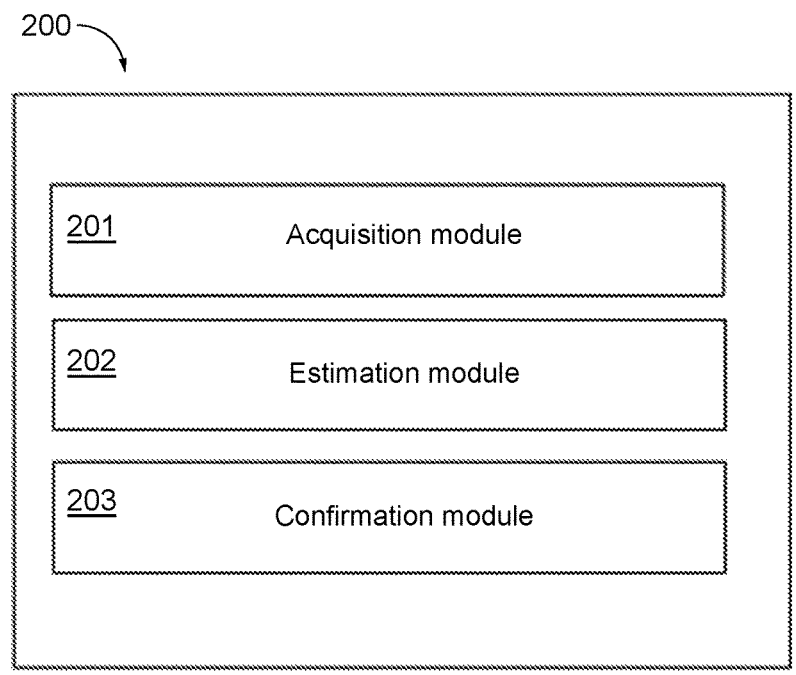
FIG. 2 is a schematic structural diagram of a short circuit detection device for a starting battery according to an embodiment of the disclosure.

Based on the above short circuit detection method for a starting battery, an embodiment of the disclosure further provides a short circuit detection device 200 for a starting battery. FIG. 2 is a schematic structural diagram of a short circuit detection device for a starting battery according to an embodiment of the disclosure. The short circuit detection device includes: an acquisition module 201 configured to acquire status information of the starting battery in real time; an estimation module 202 configured to estimate an SOC of the starting battery by means of ampere-hour integral based on the status information; and a confirmation module 203 configured to confirm, based on an estimation result for the SOC, whether the starting battery is short-circuited.

It can be understood that in addition to the modules listed above, the disclosure further includes other modules capable of implementing the short circuit detection method for a starting battery provided in the disclosure.

The disclosure provides, in another aspect, a computer-readable storage medium storing an executable instruction, a software program and modules, where the executable instruction, when executed by a processor, causes the short circuit detection method for a starting battery to be performed. The readable storage medium may include a high speed random access memory, or may include a non-volatile memory, such as at least one magnetic disk storage device, a flash memory device or other non-volatile solid state storage devices, and can be applied to various terminals, which can be a computer, a server, etc.

An embodiment of the disclosure further provides a computer program product that, when running on a computer, causes the computer to perform the above related steps, to realize the short circuit detection method for a starting battery in the above embodiment.

The foregoing descriptions are merely preferred embodiments of the disclosure, and are not intended to limit the disclosure in any form. Although the disclosure has been disclosed as above by means of the preferred embodiments, these embodiments are not for the purpose of limiting the disclosure. Those skilled in the art can make alterations or modifications to the technical contents disclosed above without departing from the technical solutions of the disclosure so as to arrive at equivalent embodiments with equivalent changes. However, any simple amendments, equivalent changes and modifications made to the above embodiments according to the technical essence of the disclosure without departing from the technical solutions of the disclosure are still within the scope of the technical solutions of the disclosure.

The invention claimed is:

1. A short circuit detection method for a starting battery, the method comprising:
   acquiring status information of the starting battery in real time, wherein the status information comprises current and time;
   estimating a state of charge (SOC) of the starting battery by an ampere-hour integral based on the status information; and
   confirming, based on an estimation result for the SOC, whether the starting battery is short-circuited;
   characterized in that the step of confirming comprises:
   drawing an SOC curve according to an estimation result for the SOC, and
      confirming that the starting battery is in a short-circuited condition when the SOC curve initially increases within a predetermined period of time and then maintains constant, or
      confirming that the starting battery is not short-circuited when the SOC curve initially decreases and then increases in cycle.

2. The short circuit detection method for a starting battery according to claim 1, wherein the status information further comprises voltage.

3. The short circuit detection method for a starting battery according to claim 2, further comprising setting a state-of-charge threshold (SOC threshold) of the starting battery, wherein the SOC threshold of the starting battery is set such that a power battery charges the starting battery when the SOC of the starting battery is equal to or lower than the SOC threshold.

4. The short circuit detection method for a starting battery according to claim 3, further comprising setting a voltage threshold of the starting battery, wherein the voltage threshold of the starting battery is set such that a power battery charges the starting battery when a voltage of the starting battery is equal to or lower than the voltage threshold of the starting battery.

5. The short circuit detection method for a starting battery according to claim 4, wherein the voltage threshold is lower than a voltage value of the starting battery when the SOC of the starting battery is at the SOC threshold.

6. The short circuit detection method for a starting battery according to claim 5, wherein the method further comprises:

sending the estimation result for the SOC to a vehicle control unit;

sending, by the vehicle control unit, the estimation result for the SOC to a central gateway;

sending, by the central gateway, the estimation result for the SOC to a cloud database; and confirming, by the cloud database, that the starting battery is in the short-circuited condition or not.

7. The short circuit detection method for a starting battery according to claim 6, wherein the cloud database confirms that the starting battery is in the short-circuited condition when the SOC of the starting battery initially increases to 100% within the predetermined period of time and then maintains constant.

8. A non-transitory computer-readable storage medium, storing executable program code instructions that, when executed by a computer processor, causes the short circuit detection method for a starting battery according to claim 1 to be performed.

9. A short circuit detection device for a starting battery, the device comprising:
 an acquisition module configured to acquire status information of the starting battery in real time;
 an estimation module configured to estimate a state-of-charge (SOC) of the starting battery by an ampere-hour integral based on the status information; and
 a confirmation module configured to confirm, based on an estimation result for the SOC, whether the starting battery is short-circuited;
 characterized in that the confirmation module is further configured to draw an SOC curve according to an estimation result for the SOC, and to confirm that the starting battery is in a short-circuited condition if the SOC curve initially increases within a predetermined period of time and then maintains constant, or to confirm that the starting battery is not short-circuited if the SOC curve initially decreases and then increases in cycle.

\* \* \* \* \*